(12) United States Patent
McCallion

(10) Patent No.: US 9,298,023 B2
(45) Date of Patent: Mar. 29, 2016

(54) OPTICAL BEAM STEERING FOR TUNABLE LASER APPLICATIONS

(71) Applicant: FINISAR CORPORATION, Sunnyvale, CA (US)

(72) Inventor: Kevin J. McCallion, Charlestown, MA (US)

(73) Assignee: FINISAR CORPORATION, Sunnyvale, CA (US)

( * ) Notice: Subject to any disclaimer, the term of this patent is extended or adjusted under 35 U.S.C. 154(b) by 0 days.

(21) Appl. No.: 14/444,533

(22) Filed: Jul. 28, 2014

(65) Prior Publication Data

US 2014/0333986 A1 Nov. 13, 2014

Related U.S. Application Data

(60) Division of application No. 12/188,407, filed on Aug. 8, 2008, now Pat. No. 8,792,531, which is a continuation-in-part of application No. 10/786,839, filed on Feb. 25, 2004, now Pat. No. 7,630,425.

(60) Provisional application No. 60/449,917, filed on Feb. 25, 2003, provisional application No. 60/463,063, filed on Apr. 15, 2003.

(51) Int. Cl.
*H01S 3/10* (2006.01)
*G02F 1/01* (2006.01)
(Continued)

(52) U.S. Cl.
CPC .......... *G02F 1/0147* (2013.01); *G02B 26/0883* (2013.01); *G02F 1/29* (2013.01); *H01S 3/0085* (2013.01); *H01S 3/10* (2013.01); *H01S 5/02292* (2013.01); *H01S 5/12* (2013.01); *H01S 5/4031* (2013.01); *G02B 6/2931* (2013.01); *G02B 6/29311* (2013.01); *G02B 6/29313* (2013.01); *G02F 2201/16* (2013.01); *H01S 3/08004* (2013.01); *H01S 3/08009* (2013.01); *H01S 5/005* (2013.01); *H01S 5/02248* (2013.01); *H01S 5/02284* (2013.01); *H01S 5/0612* (2013.01); *H01S 5/141* (2013.01); *H01S 5/142* (2013.01); *H01S 5/146* (2013.01); *H01S 5/4012* (2013.01);
(Continued)

(58) Field of Classification Search
CPC ..... H01S 3/0071; H01S 3/101; H01S 3/1075; H01S 5/02292; H01S 5/02438; H01S 5/02446; H01S 5/4012; H01S 5/4075; G02B 26/0883
USPC .................. 372/100, 50.12, 50.121, 50.122; 359/298, 831, 837
See application file for complete search history.

(56) References Cited

U.S. PATENT DOCUMENTS

| 6,810,047 B2 * | 10/2004 | Oh et al. .......................... 372/20 |
| 6,836,487 B1 * | 12/2004 | Farmer et al. ..................... 372/3 |
| 2002/0122256 A1 * | 9/2002 | Mitamura et al. ............. 359/577 |

*Primary Examiner* — Tod T Van Roy
(74) *Attorney, Agent, or Firm* — Maschoff Brennan

(57) ABSTRACT

Methods for tuning a transmitter to a selected wavelength are disclosed. A transmitter including a laser array comprising a plurality of lasers spatially offset from one another and each having a laser output having a unique wavelength. A first prism is positioned to impart a first angular shift to the laser outputs to produce and a second prism is positioned to impart a second angular shift opposite the first angular shift on the outputs. An index modulating element is coupled to one of the first and second prisms and a controller is electrically coupled to the index modulating element to control an angle of light output form the second prism. An optical spectrum reshaper may be positioned between the second prism and the lens and have at least one transmission edge aligned with the wavelength at least one of the lasers.

20 Claims, 7 Drawing Sheets

(51) Int. Cl.
  *H01S 5/022* (2006.01)
  *G02B 26/08* (2006.01)
  *G02F 1/29* (2006.01)
  *H01S 5/12* (2006.01)
  *H01S 3/00* (2006.01)
  *G02B 6/293* (2006.01)
  *H01S 5/00* (2006.01)
  *H01S 5/06* (2006.01)
  *H01S 5/14* (2006.01)
  *H01S 5/40* (2006.01)
  *H01S 3/08* (2006.01)

(52) U.S. Cl.
  CPC .............. *H01S 5/4062* (2013.01); *H01S 5/4075* (2013.01); *H01S 5/4087* (2013.01)

OPTICAL BEAM STEERING FOR TUNABLE LASER APPLICATIONS

CROSS-REFERENCE TO RELATED APPLICATIONS

This application is a Divisional of U.S. patent application Ser. No. 12/188,407, filed Aug. 8, 2008 which is a continuation-in-part of U.S. patent application Ser. No. 10/786,839, filed Feb. 25, 2004, which claims the benefit of provisional application No. 60/449,917 filed Feb. 25, 2003 and provisional application No. 60/463,063 filed Apr. 15, 2003, all of which are incorporated herein by reference in their entireties and for all purposes.

BACKGROUND OF THE INVENTION

1. The Field of the Invention

This invention has applications in telecommunications and spectroscopy

2. The Relevant Technology

The emergence of DWDM technology as a viable solution to bandwidth bottlenecks in current and future optical networks has generated a need for spectrally tunable optical components. In particular, tunable laser sources that can be deployed along with high speed, intensity modulator components are required. Several different technologies and approaches have been adopted in an effort to provide a low-cost, high performance, tunable laser sources that meet the specifications called for by today's network operators.

A number of tunable laser implementations make use of micro-electro-mechanical systems (MEMS) for their successful operation. These include ECLs and DFB arrays where a mechanical adjustment allows selection of the desired laser wavelength. The DFB array approach has particular attractions in that well-understood, reliable DFB laser technology is used, albeit in array form. In this implementation, up to 12 DFBs are fabricated on the same chip with a separation of around 10 µm between adjacent lasers. The center wavelength, at fixed temperature, is offset by approximately 3 nm between adjacent lasers and each laser can be temperature tuned to cover 3 nm. Thus, full C band tuning can be realized by selectively tuning the lasers within their local thermal range and switching to the adjacent laser as required.

However, the spatial offset of the individual lasers within the array makes efficient coupling to a single optical fiber difficult. A single lens can be used to collect and collimate the light from each of the DFB laser sources but the spatial offset results in a varying angle on the collimated beam. This leads to a spatial offset when the beams are focused onto a single optical fiber that is located in a fixed position in the focal plane of a second lens. Thus, efficient coupling can only be obtained for the DFB laser at the center of the array.

The above situation can be remedied by incorporating a beam steering element in the optical path between a collimating lens and a focus lens. Typically, this could be a MEMS minor that can be electrostatically tuned via application of a control voltage. This approach suffers from vibration issues that are known to plague MEMS type implementations.

As a result, one object of this invention is to provide a low cost, low power consumption, multiplexing solution to coupling of an array of DFB lasers (spatially and spectrally offset). The described approach removes the need for a complicated MEMS beam steering minor and reduces sensitivity to vibration effects, etc.

SUMMARY

In one embodiment, an optical transmitter includes a laser array comprising a plurality of lasers spatially offset from one another and each having a laser output having a unique wavelength. A first prism is positioned to impart a first angular shift to the laser outputs to produce first angularly shifted outputs. A second prism is positioned to impart a second angular shift to the first angularly shifted outputs to produce second angularly shifted outputs. The second angular shift is in a direction opposite the first angular shift. An output lens is positioned to receive a first output of the second angularly shifted outputs incident on the lens. An index modulating element is coupled to one of the first and second prisms and a controller is electrically coupled to the index modulating element. The controller is programmed to selectively power the index modulating element an amount effective to alter one of the first and second angular shifts sufficiently to cause a second output of the second angularly shifted outputs to be incident on the lens.

In another embodiment, an optical spectrum reshaper is positioned between the second prism and the lens. The optical spectrum reshaper has at least one transmission edge aligned with the wavelength at least one of the lasers.

In another embodiment the transmitter includes an array of first photodiodes and a second photodiode. A tap splitter is positioned between the second prism and the optical spectrum reshaper and is configured to divert a portion of the second angularly shifted outputs onto the array of first photodiodes and configured to divert a portion of light reflected from the optical spectrum reshaper onto the second photodiode. The controller is electrically coupled to the array of first photodiodes and is programmed to control power supplied to the index modulating element according to outputs of the array of first photodiodes. The controller is also electrically coupled to the plurality of lasers and operable to control the wavelengths of the plurality of lasers according to a ratio of an output of the second photo diode and a combination of the outputs of the array of first photodiodes.

Embodiments relating to methods for tuning a transmitter to a selected wavelength are also disclosed. In an example, a method includes selecting a laser having the selected wavelength within a tunable range thereof from an array of tunable lasers. The selected laser is tuned to the selected wavelength, and an index of refraction of a first prism and a second prism is tuned, where the first prism is positioned to receive the output of the selected laser and the second prism is positioned to receive an output of the first prism, and to at least partially reverse an angular shift in the output of the first prism relative to the output of the laser. The output of the second prism is incident on an optical spectrum reshaper. The method further includes the step of frequency modulating the selected laser so that the output of the laser is frequency modulated. The output of the laser is transmitted through an optical spectrum reshaper that is configured to at least partially convert frequency modulation in the output of the laser to amplitude modulation.

In one embodiment, the method might also include the step of determining an operating temperature for the optical spectrum reshaper at which a transmission function of the optical spectrum reshaper has a transmission edge corresponding to the selected wavelength and driving a temperature of the optical spectrum reshaper to the operating temperature.

In one embodiment, the tuning of the index of refraction of one of the first and second prisms is accomplished by diverting a portion of the output of the second prism to an array of first photodiodes and controlling power supplied to an index modulating element coupled to one of the first and second prisms according to outputs of the array of first photodiodes.

In one embodiment, the step of tuning the selected laser to the selected wavelength is accomplished by diverting a portion of light reflected from the optical spectrum reshaper onto a second photodiode and controlling the wavelength of the selected laser according to a ratio of an output of the second photodiode and a combination of the outputs of the array of first photodiodes.

These and other features of the present invention will become more fully apparent from the following description and appended claims, or may be learned by the practice of the invention as set forth hereinafter.

BRIEF DESCRIPTION OF THE DRAWINGS

These and other objects and features of the present invention will be more fully disclosed or rendered obvious by the following detailed description of the preferred embodiments of the invention, which is to be considered together with the accompanying drawings wherein.

DETAILED DESCRIPTION OF THE PREFERRED EMBODIMENTS

As described by the present invention, a thermally tuned beam steering element can be used in the optical path. A prism fabricated from a thermo-optic material can effectively act as an optical beam steering element by controlling the temperature. This beam steering element can be incorporated into various optical subassemblies to provide improved functionality e.g. wavelength tunable lasers.

This approach allows lower cost and simpler implementation while avoiding vibration-induced detrimental effects.

Figure 1:
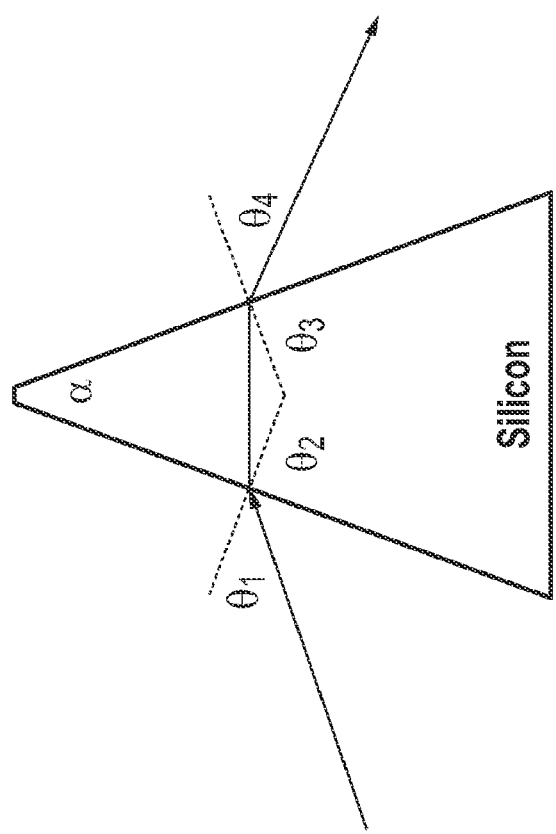
FIG. 1 is a schematic diagram of a prism beam steering element.

More particularly, by inserting a prism into the collimated beam path, it is possible to vary the angle of the beam by changing the refractive index of the prism material. Preferably, this can be done in an isotropic fashion by using a high dn/dT material such as a crystalline semiconductor such as Silicon, Gallium Arsenide or Indium Phosphide. Silicon is particularly convenient due to its ease of processing and low optical loss in the 1550 nm region when in pure, un-doped crystalline form. FIG. 1 shows the beam steering function of the prism.

It can be shown that the following equation holds for the prism beam steering function:

$$\sin\theta_4 = \sin\alpha\sqrt{n^2\sin^2\theta_1} - \cos\alpha\sin\theta_1$$

The above equation shows that the exit angle of the beam is dependent on the input angle, the prism angle and the refractive index of the prism material. For practical use, the refractive index can be varied via the thermo-optic effect. As an example, the graph shown in FIG. 2 shows a plot of the output angle variation that can be achieved via temperature control of the prism.

Figure 2:
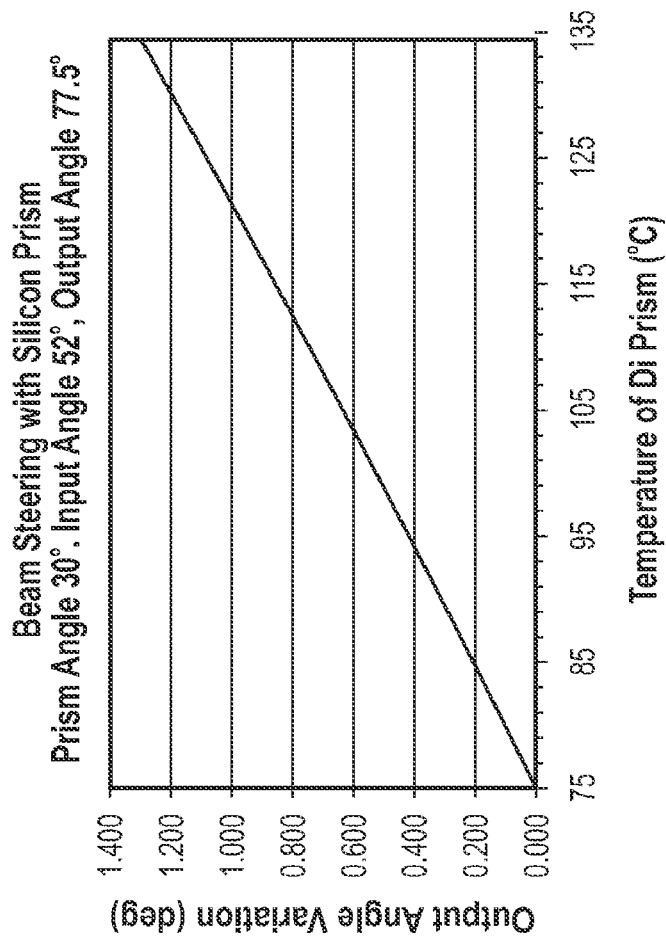
FIG. 2 is a graph showing temperature induced beam steering.

FIG. 2 shows that a significant amount of beam steering can be achieved for around 50° C. of temperature variation. However, the beam size and shape (and aberration) is also affected by the prism and should be considered in a practical design/implementation.

Upon passing through the prism interfaces, the beam width in the horizontal direction is magnified according to the equation below:

$$M = \frac{\cos\theta_2}{\cos\alpha\theta_1}\frac{\cos\theta_4}{\cos\theta_3}$$

where the angles are defined as in FIG. 1.

Passing the beam through the steering prism causes aberration and beam quality degrades, leading to a reduction in fiber coupling efficiency. This problem can be avoided by passing the beam through a second "correction" prism to "undo" the aberration. This restores the original optical beam shape and quality but the beam angle variation still remains. The design of the second "correction" prism (located either before or after the diffraction grating) can be arranged that it corrects for aberration induced by the steering prism plus aberration/beam shaping induced by the grating itself.

A typical implementation uses crystalline Silicon as the prism material with anti-reflection coatings on the interacting surfaces. Temperature control of the prism is efficiently achieved by mounting the prism onto a thermally insulative base that has been patterned with a metal strip heater. A thermistor is located on the top surface of the prism to allow temperature monitoring and feedback. The power consumption can be minimized by keeping the dimensions of the prism as small as possible for the given optical beam size. Angles of incidence and exit also have an impact on possible prism dimensions.

Other potential component implementations can be developed based on the optical beam steering element. These include variable optical attenuators, beam shutters, tunable filters, and other external cavity laser designs (using SOA as gain medium).

A preferred embodiment that uses the optical beam steering element is in a tunable laser design that is based on a DFB laser array.

Figure 3:
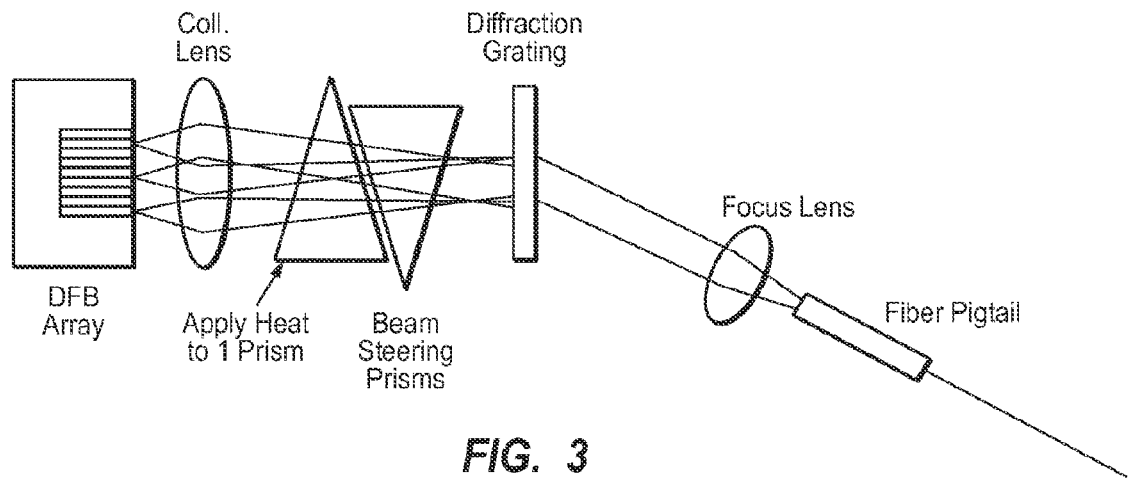
FIG. 3 is a schematic diagram showing a tunable laser based on a DFB array, beam steering prism and diffraction grating (transmission, reflection grating or hologram) (each DFB laser is thermally tuned over 400 GHz)

An optical beam steering approach as applied to a tunable laser based on a DFB array is shown in FIG. 3.

The principle of operation is based on spatial multiplexing of the light emitted by each individual DFB array element (different emission wavelengths) using the diffraction grating. The grating is designed to multiplex the array elements for a set condition of wavelengths and array pitch. The function of the beam steering prism is to compensate for the shift in wavelength when each DFB array element is tuned by varying the temperature of the laser.

From FIG. 3, the offset of the DFB array elements from the center element results in a slight beam angle after the collimation lens, with respect to the center element. Typically, for an array pitch of 10 um and array size of 12 DFB lasers, the elements at the extremes of the array are physically separated from the center element by 50 μm. For an even number of elements on a 10 μm pitch, there is a further 5 μm offset from the spatial center of the array. Therefore, the outlying DFB elements are 55 μm from geometrical center. If a 3 mm focal length collimating lens is used, the approximate angle of the collimated beams relative to the optical axis of the lens, is given by $\tan(\theta)=55/3000$ with $\theta=1.05°$. For adjacent DFB elements, the resultant angular dispersion is $\delta\lambda/\delta\theta = 3$ nm/$\tan^{-1}(10/3000)=900$ nm/rad.

The DFB array is designed such that the emission wavelength of each element is offset from its nearest neighbor by 3 nm. Thus, a 12 DFB array can cover a spectral range of 36 nm, assuming that each individual element is capable of tuning 3 nm via temperature variation. The spatial (resulting in beam angle) and spectral offset between adjacent array elements can be used to design a grating that compensates for the beam angle induced by the collimating lens.

The invention can be implemented using a range of diffraction grating options: (1) transmission type, (2) reflection type, or (3) hologram type. Types 1 and 2 are generally surface relief style geometries. Type 3 is fabricated by inducing spatially-dependent refractive index changes within a transparent material (often a crystalline material).

The well-known equation for a grating is:

$$m\delta = d(\sin\alpha + \sin\beta) \quad (1)$$

where m is the diffracted order, λ is the incident wavelength, d is the spacing between adjacent grooves on the grating surface, α is the angle of incidence and β is the diffracted angle.

For the arrangement shown in FIG. 3, the incident angle is normal to the grating and the equation above collapses to:

$$m\lambda = d\sin\beta \quad (2)$$

To perform the necessary multiplexing function required as described above, the angular dispersion of the grating should satisfy the relation below:

$$\frac{\delta\lambda}{\delta\beta} = \frac{d}{m}\cos\beta \quad (3)$$
$$= 900$$

where units are in nm/rad.

Figure 3A:
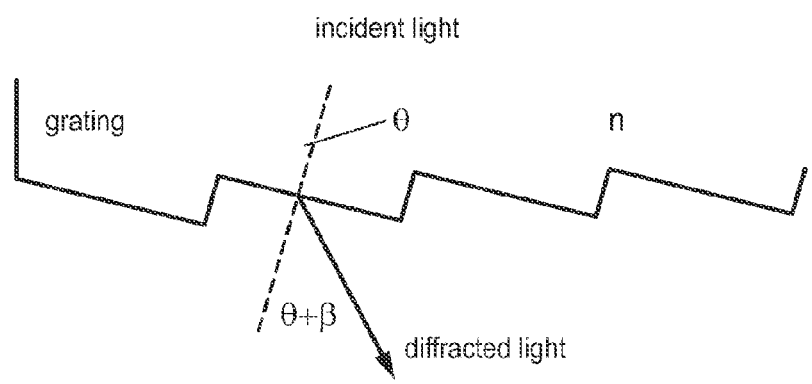
FIG. 3A is a schematic diagram showing diffraction with a grating.

This matches the angular dispersion from the DFB array combined with collimating lens. Using equations (2) and (3), and a center wavelength of 1550 nm, the value of β is calculated as 59.9°. i.e. the transmitted beam exits the grating at a nominal angle of 59.9°. The most efficient operation of the grating occurs when the refraction of the mini-prism that constitutes a groove (in the grating) lies in the same direction as the diffraction given by the grating equation. Applying Snell's Law to the interface between the groove facet and air (see FIG. 3A), the following equation holds:

$$n\sin\theta = \sin(\theta+\beta) \quad (4)$$

where n is the refractive index of the grating material.

Combining the grating equation and Snell's law provides the relationship between the blaze angle $\beta_B$ and the groove angle θ

$$\tan\theta = \frac{\sin\beta_B}{n - \cos\beta_B} \quad (5)$$

The transmission grating design for the preferred embodiment can be derived from the above equations.

Figure 4:
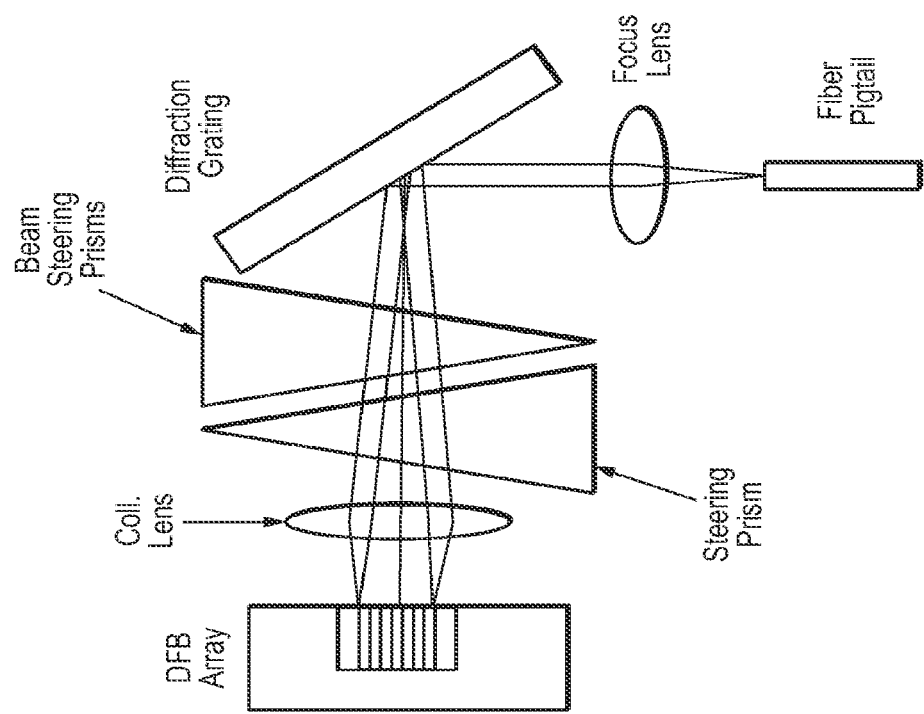
FIG. 4 is a schematic diagram showing a tunable laser with a reflection grating.

FIG. 4 shows the invention implemented with a reflection-style diffraction grating. For this implementation, a typical geometry could use an angle of incidence of 30° to the grating with a diffracted angle of around 68.5°. Beam aberration can be corrected with a prism prior to coupling to optical fiber.

The invention could also be implemented using a holographically written (formed) grating with a similar geometry to the transmission grating described above.

A modification to the preferred embodiment uses an optical beam steering prism alone (with no grating component) to compensate for spatial/spectral offset of two or more DFB array elements. In this case, the prism beam steering element is required to compensate for angular deviation of 0.2° per DFB array element. Multiplexing of up to 3 array elements should be possible with a reasonable amount of electrical power consumption for the heater and no significant degradation in coupling efficiency. This assumes that the effect of refractive index dispersion of Silicon is negligible.

In addition to thermo-optical effects which steers the direction of the beam of light we also claim the use of prisms made of electro-optic and magneto-optic materials to achieve the same. In electro-optic approach an electrical voltage could be applied to the prism (made out of materials such as $LiNbO_3$, $Sr_xBa_{1-x}Nb_2O_3$ (SBN:x) etc. The voltage can be applied to any two surfaces to induce an electro-optic index change. Similarly the prism may be made of magneto-optic materials whose effective index of refraction could be changed by applying a magnetic field to the material via a coil adjacent to the prism.

Numerous advantages of the present invention will be apparent to those skilled in the art. Among other things, the advantages of the invention include low cost, simple implementation, beam steering with no moving parts, low power consumption (related to prism size, material, etc.). These advantages lead to cost savings and performance enhancement in tunable laser systems based around the prism optical beam steering element.

Figure 5:
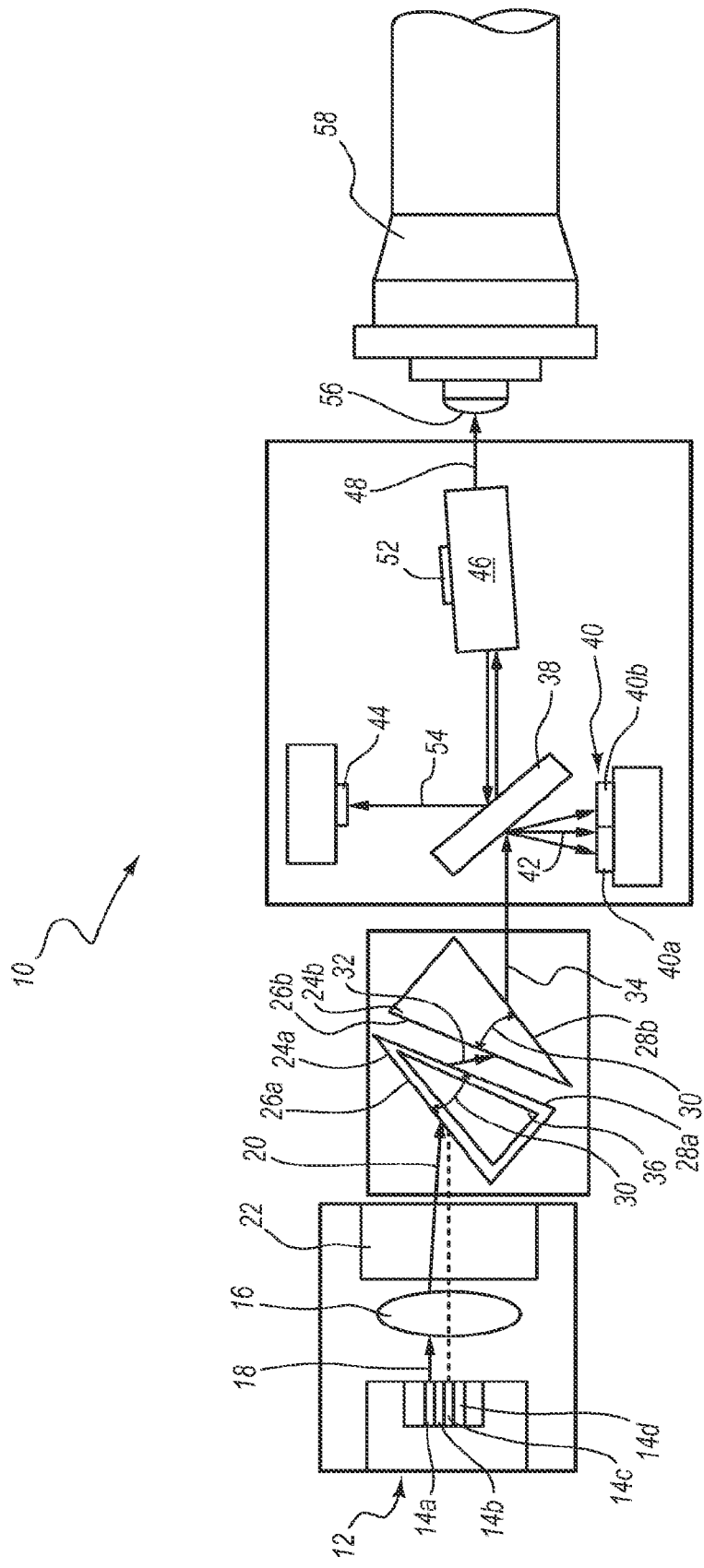
FIG. 5 is a schematic diagram showing a tunable laser with a prism beam steering element and an optical spectrum reshaper in accordance with an embodiment of the present invention.

Referring to FIG. 5, in some embodiments, a transmitter 10 includes an array 12 of lasers 14a-14d. In a preferred embodiment, the lasers 14a-14d are embodied as distributed Bragg reflector (DBR) lasers 14a-14d, each of which may have a tunable wavelength range of at least 10 nanometers. The lasers 14a-14d each have a unique wavelength. In some embodiments, the wavelength separation between the lasers 14a-14d are equal to a multiple of a nominal Δλ when no individual heating or other tuning signal is applied. However, process variations may cause the actual separation between lasers 14a-14d having adjacent nominal wavelengths to be different from Δλ by as much as 15% of Δλ, preferably less than 10% of Δλ.

In the illustrated embodiment, the lasers 14a-14d are formed on a common substrate, such as a semiconductor suitable for optical applications, such as InP. The lasers 14a-14d are parallel to one another and emit parallel to one another. Each laser 14a-14d is offset from an adjacent laser 14a-14d in a direction perpendicular to the output beams by an offset distance. As a result, the lasers 14a and 14d located on opposing ends of the array 12 are offset by a multiple of the offset between adjacent lasers.

A collimating lens 16 is positioned to receive output beams 18 from the lasers 14a and to output corresponding collimated beams 20. In the illustrated embodiment, a single collimating lens 16 is used. Due to the spatial offset of the lasers 14a-14d the collimated beams 20 are angularly shifted relative to one another and an optical axis of the collimating lens upon exiting the collimating lens 16. The angular offset may be reduced by means of a tunable prism pair discussed below. In some embodiments, an optical isolator 22 is positioned between the collimating lens 16 and the laser array 12 to reduce back reflection.

Table 1 shows examples of beam angle dependence on the focal length of the collimating lens 16. In the example of Table 1, it is assumed that the maximum lateral offset of the 4th DBR laser element is 20 um from the optical axis of the lens.

TABLE 1

Impact of lens focal length on collimated beam angle for 20 μm lateral offset laser array

| Focal Length (mm) | Angle Tuning Requirement (deg) (assumes 20 μm offset distance) |
|---|---|
| 0.5 | 2.29 |
| 0.7 | 1.64 |
| 0.745 | 1.54 |
| 1 | 1.15 |
| 1.2 | 0.95 |

A first prism 24a and a second prism 24b may be used to correct for the difference in angles of collimated beams 20 for the different lasers 14a-14d. The first prism 24a includes an input face 26a and an output face 28a at an angle 30 with respect to one another. The input face 26a is positioned to receive the collimated beams 20 and angularly shifted beams 32 are emitted from an output face 28a.

The second prism 24b includes an input face 26b and an output face 28b at an angle 30 with respect to one another. The angle 30 of the second prism 24b is preferably nominally equal to the angle 30 of the prism 24a, as constrained by manufacturing limitations, e.g. within 5%, preferably within 2%. The input face 26a is positioned to receive the first angularly shifted beams 32 and second angularly shifted beams 34 are emitted from the output face 28b.

The second prism 24b substantially restores the original optical beam shape and quality after the original beam has been reshaped and spread by the first prism 24a. The design of the second "correction" prism 26b can be arranged that it reduces aberration induced by the steering prism 24a while still preserving an angular shift.

In a preferred embodiment, the input face 26a of the first prism 24a is substantially parallel (e.g. within +/−2 degrees from parallel) to the output face 28b of the second prism 24b and the output face 28a of the first prism 24a is substantially parallel (e.g. within +/−2 degrees from parallel) to the input face 26b of the first prism 24b.

An index modulating element 36 is positioned on one of the first and second prisms 24a, 24b. The index modulating element 36 may be embodied as a heater or thermoelectric cooler where the prisms 24a, 24b are formed of a thermooptic material. In embodiments where the prisms 24a, 24b are formed of an electrooptic material, the index modulating element 36 may be embodied as an electrode for receiving a voltage or current. The index modulating element 36 is used to control the angle of the second angularly shifted outputs 34 in order to compensate for the spatial offset of the lasers 14a-14d.

The size of the prisms 24a, 24b may be chosen according to a focal length of the collimating lens 16. A larger focal length may advantageously reduce the difference in the angles of the collimated beams 20. However, the larger focal length may also result in a larger collimated beam size and subsequent larger aperture requirements on all the components in the optical train. Furthermore, an oblique angle of the input face 26a of the first prism 24a relative to the collimated beam 20 results in a large beam size and a corresponding large prism size. Tables 2 and 3 illustrate details of beam size and prism length. One possible configuration is an f=1 mm collimating lens 16, which is used in one embodiment.

TABLE 2

Collimated beam size for range of Lens focal length

| Focal Length (mm) | $1/e^2$ Coll beam Size (mm) (assumes 30° FFP, NA = 0.43) |
|---|---|
| 0.5 | 0.43 |
| 0.7 | 0.602 |
| 0.745 | 0.6407 |
| 1 | 0.86 |
| 1.2 | 1.032 |

TABLE 3

Length of Silicon prism vs. Collimated Beam Size

| Collimated Beam Size | Length of Silicon Prism (70o AOI) |
|---|---|
| 0.5 mm | 1.46 |
| 1 mm | 2.92 |
| 1.5 mm | 4.39 |
| 2 | 5.85 |

Performance for prisms 24a, 24b formed of silicon having a refractive index of 3.48 and temperature sensitivity of $1.8e^{-4}$, is outlined in Table 4, below. In Table 4, prism angle refers to the angle of the normal vector of the input face 26a of the first prism 24a relative to the optical axis of the collimating lens 16. Input angle refers to the angle between a direction of propagation of one of the collimated beams 20 relative to the same normal vector. Δn refers to the index in one of the prisms 24a, 24b in order to compensate for a given input angle and ΔT refers to the temperature change required to achieve a given Δn. As is apparent from Table 4, manageable relative coupling losses and efficiency drops may be achieved using the prism pair 24a, 24b.

TABLE 4

Prism Parameters

| Prism Angle | Input Angle | Δn | ΔT | Relative Coupling Loss % | Max Efficiency Drop % |
|---|---|---|---|---|---|
| 30 | 55 | 0.0202 | 112 | 6.00 | 2.60 |
| 30 | 60 | 0.01769 | 98 | 6.00 | 2.60 |
| 30 | 65 | 0.01492 | 83 | 7.00 | 2.80 |
| 30 | 70 | 0.0121 | 67 | 8.00 | 2.60 |
| 30 | 75 | 0.009075 | 50 | 10.00 | 2.60 |
| 30 | 80 | 0.006009 | 33 | 15.00 | 4.50 |
| 25 | 70 | 0.0145 | 81 | 9.00 | 3.50 |
| 32 | 70 | 0.01124 | 62 | 10.00 | 4.50 |
| 32 | 70 | −0.01195 | −66 | 3.00 | 2.50 |

In some embodiments, a tap splitter 38 diverts a fraction of the light in the second angularly shifted outputs 34 toward an array of first photodiodes 40. The array 40 includes two or more photodiodes 40a, 40b disposed adjacent one another along a line perpendicular to a propagation direction of the diverted beam 42 from the tap splitter 38. The amplitude of the outputs of the array 40 indicate the angle of the diverted beam 42, inasmuch as changing the angle of the beam 42 will change the amount of the beam 42 incident on each diode of the array 40. A controller receives the outputs from the array 40 and controls power supplied to the index modulating element 36 such that a ratio of the outputs conforms to a pre-calibrated value.

The portion of the second angularly shifted beam 34 that is transmitted through the tap splitter 38 is incident on an optical spectrum reshaper (OSR) 46, which outputs a filtered beam 48. The OSR 46 may be embodied as one or more filters, including, but not limited to, a single cavity filter, coupled multi-cavity (CMC) filter, a thin film coupled multi-cavity filter, a periodic multi-cavity etalon, a fiber Bragg grating, a ring resonator filter, or any other optical element having a wavelength-dependent loss. The OSR 46 may also comprise a fiber, a Gire-Tournois interferometer, or some other element with chromatic dispersion. The OSR 46 may be fabricated as a solid optical element or may include gas-filled gaps, such as an OSR 46 embodied as a periodic multi-cavity etalon. In such embodiments, xenon, or other gas may be present in the gas-filled gaps.

A portion of the light not transmitted by the OSR 46 is reflected back toward the tap splitter 38. A diverted portion 54 of the back reflected beam is incident on a second photodiode 44. The output of the photodiode 44 indicates the spectral position of the second angularly shifted beam inasmuch as the amount of reflected light is dependent on its wavelength relative to the transmission function of the OSR 46. Accordingly, a controller may receive the output of the photodiode 44 and tune the lasers 14a-14d such that a ratio of the output of the photodiode 44 and a combination of the outputs of the array of first photodiodes 40 approaches a pre-calibrated value. For example, the outputs of the first photodiodes 40 may be averaged prior to calculating a ratio of the average of the outputs of the array of first photo diodes 40 and an output of the second photodiode 44.

The output of the OSR 46 may be incident on an output lens 56 that focuses the filtered beam 48 with respect to coupling optics 58 that couple the filtered beam to an output fiber. The filtered beam 48 is then transmitted over the fiber to a receiver.

Figure 6:
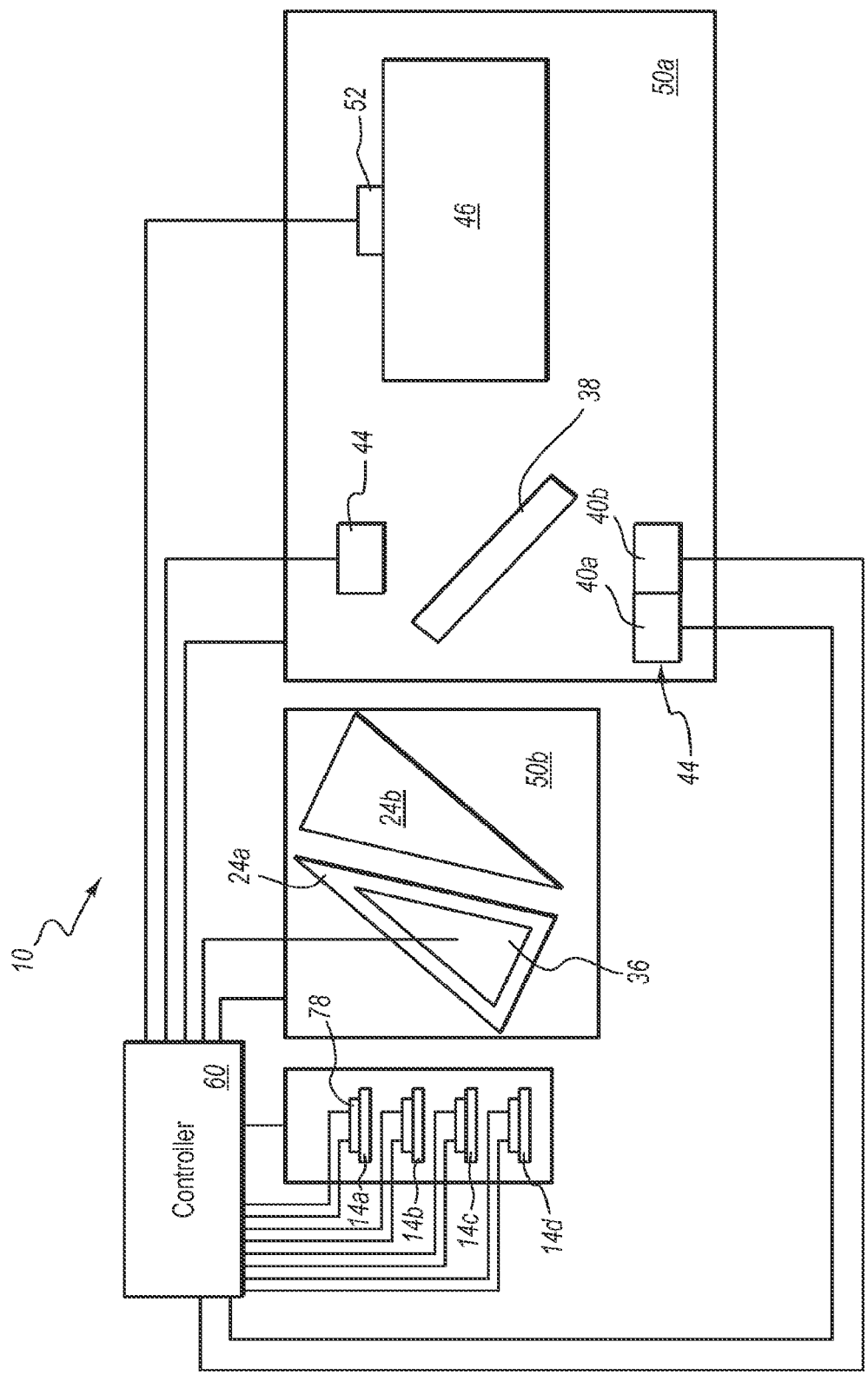
FIG. 6 is a schematic diagram illustrating a controller coupled to a tunable laser having a beam steering element and an optical spectrum reshaper in accordance with an embodiment of the present invention.

Referring to FIG. 6, a controller 60 may be electrically coupled to a thermo electric cooler (TEC) 50a on which the OSR 46 is mounted. The controller may monitor an output of the thermistor 52 in order to control power supplied to the TEC 50a, such that the temperature of the OSR 46 is driven toward a set temperature. In some embodiments, the array of first photodiodes 40, second photodiode 44, and tap splitter 38 are also mounted to the TEC 50a.

The controller 60 may also be electrically coupled to a second TEC 50b on which the prisms 24a, 24b are mounted. The controller 60 may control current supplied to the TEC 50b to compensate for changes in environmental temperature and to tune the angular shift of the prisms 24a, 24b.

Figure 7:
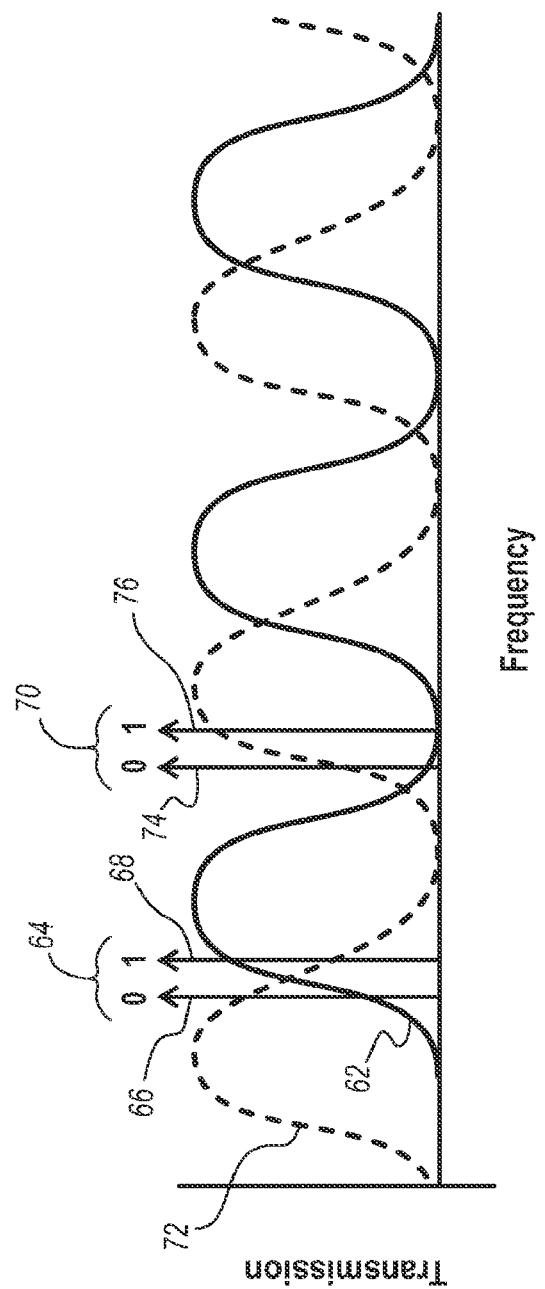
FIG. 7 is a graph illustrating the transmission function of an optical spectrum reshaper relative to base and peak frequencies of a frequency modulated signal in accordance with an embodiment of the present invention.

Referring to FIG. 7, while still referring to FIG. 6, the OSR 46 preferably has a periodic transmission function represented by line 62 having a number of transmission peaks with various transmission edges. In some applications, the outputs 18 of the lasers 14a-14d may be frequency modulated. In some embodiments, the outputs 18 are both frequency and amplitude modulated. In either case, the outputs 18 may include frequency excursions from a base frequency to a peak frequency, with the excursions encoding digital data. In some modulation formats, data may be encoded in the phase of the peak frequency portions such that the frequency excursions do not encode data, but rather separate individual bits.

As shown in FIG. 7, an output signal may have a signal frequency pair 64 having a base frequency 66 and a peak frequency 68. The transmission function has lower transmission at the base frequency 66 than at the peak frequency 68. The filtered signal 48 output by the OSR 46 will therefore have an increased extinction ratio relative to the outputs 18.

In order to perform the filtering function with respect to the signal frequency pair 70, the transmission function may be shifted such that the transmission function is represented by dotted line 72. The base frequency 74 and peak frequency 76 are therefore located on a transmission edge with the base frequency 74 experiencing greater attenuation.

Wide tunability of the transmitter 10 may therefore be accomplished by tuning one of the transmission edges of the OSR 46 such that one or both of a desired base and/or peak frequency lie thereon, or the transmission edge lies therebetween. One of the lasers 14a-14d having the desired base and peak frequency within its tuning range may then be tuned such that frequency modulated signals emitted therefrom have frequency excursions between the base and peak frequency.

Referring again to FIG. 6, the controller 60 may be programmed to receive or calculate a set frequency at which the transmitter 10 is to output optical signals. The set frequency may represent either the base frequency, peak frequency, or some intermediate value. The controller 60 may then consult a calibration table or function to determine a temperature of the OSR 46, or output of the thermistor 52, at which the OSR 46 has a transmission edge including the set frequency. The controller 60 then drives the TEC 50a until the output of the thermistor 52 is equal to the calibrated value corresponding to the set frequency. The controller 60 may also select one of the lasers 14a-14d having the set frequency within its tuning range. The controller 60 may then power the selected laser. The controller 60 receives outputs from the array of first photodiodes 40. The controller 60 drives power supplied to the index modulating element 36 such that the outputs of the array of first photodiodes 40 indicate that the second angularly shifted beam 34 is at a proper angle to be incident on the output lens 56.

The controller 60 also receives an output from the second photodiode 44. The controller may be programmed to calculate a ratio of the output of the second photodiode 44 and a combination of the outputs of the array of first photodiodes 40, such as an average. The controller 60 may drive power supplied to stripe heaters 78 such that the ratio of the outputs approaches a pre-calibrated value indicating that the base or peak frequency of the selected laser is equal to or within a predetermined offset amount from the set frequency.

The above mentioned steps of making adjustments to operation of the transmitter 10 according to outputs of the thermistor 52, array of first photodiodes 40, and the second photodiode 44 may be performed continuously during operation of the transmitter 10.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for tuning a transmitter to a selected wavelength comprising:

selecting a laser having the selected wavelength within a tunable range thereof from an array of tunable lasers;

tuning the selected laser to the selected wavelength;

tuning an index of refraction of one of a first prism and a second prism, the first prism positioned to receive an output of the selected laser and the second prism positioned to receive an output of the first prism and to at least partially reverse an angular shift in the output of the first prism relative to the output of the selected laser, an output of the second prism being incident on an optical spectrum reshaper;

driving a temperature of the optical spectrum reshaper to an operating temperature at which a transmission function of the optical spectrum reshaper has a transmission edge corresponding to the selected wavelength;

frequency modulating the selected laser such that the output of the selected laser is frequency modulated; and transmitting the output of the selected laser through the optical spectrum reshaper configured to at least partially convert frequency modulation in the output of the selected laser to amplitude modulation.

2. The method of claim 1, wherein tuning the index of refraction of one of the first and second prisms comprises:

diverting a portion of the output of the second prism to an array of first photodiodes; and controlling power supplied to an index modulating element coupled to one of the first and second prisms according to outputs of the array of first photodiodes.

3. The method of claim 2, wherein tuning the selected laser to the selected wavelength comprises:

diverting a portion of light reflected from the optical spectrum reshaper onto a second photodiode; and controlling the wavelength of the selected laser according to a ratio of an output of the second photodiode and a combination of the outputs of the array of first photodiodes.

4. The method of claim 1, wherein the index of refraction of the first prism is tuned by controlling the temperature of the first prism.

5. The method of claim 4, wherein controlling the temperature of the first prism is achieved by mounting the first prism onto a thermally insulative base that has been patterned with a metal strip heater.

6. The method of claim 5, further comprising:

securing a thermistor to a surface of the first prism to allow the temperature of the first prism to be monitored.

7. The method of claim 1, wherein the first prism is made of a crystalline Silicon material.

8. The method of claim 1, wherein the selected laser comprises a distributed Bragg reflector (DBR) laser.

9. The method of claim 1, wherein the selected laser has a tunable wavelength range of at least 10 nanometers.

10. The method of claim 1, wherein:

the first prism includes a first input face and a first output face, the first input face receiving the output of the selected laser and the first output face emitting a first angularly shifted beam, the second prism includes a second input face and a second output face, the second input face receiving the first angularly shifted beam and the second output face emitting a second angularly shifted beam, the first input face and the second output face are parallel, and the first output face and the second input face are parallel.

11. The method of claim 1, wherein the optical spectrum reshaper is one of a single cavity filter, a coupled multi-cavity filter, a thin film coupled multi-cavity filter, a periodic multi-cavity etalon, a fiber Bragg grating, or a ring resonator filter.

12. The method of claim 1, wherein the optical spectrum reshaper is fabricated as a solid optical element.

13. The method of claim 1, wherein the optical spectrum reshaper includes gas-filled gaps.

14. The method of claim 13, wherein the gas is xenon.

15. A method for tuning a transmitter to a selected wavelength comprising:

selecting a laser having the selected wavelength within a tunable range thereof from an array of tunable lasers;

tuning the selected laser to the selected wavelength;

positioning a first prism to receive through a first input face output of the selected laser and emitting through a first output face a first angularly shifted beam and positioning a second prism to receive through a second input face the first angularly shifted beam and emitting through a second output face a second angularly shifted beam, wherein the first input face and the second output face are parallel, and the first output face and the second input face are parallel;

tuning an index of refraction of the first prism;

frequency modulating the selected laser such that the output of the selected laser is frequency modulated;

transmitting the output of the selected laser through an optical spectrum reshaper configured to at least partially convert frequency modulation in the output of the selected laser to amplitude modulation; and driving a temperature of the optical spectrum reshaper to an operating temperature at which a transmission function of the optical spectrum reshaper has a transmission edge corresponding to the selected wavelength.

16. The method of claim 15, wherein the second prism at least partially reverses an angular shift in the first angularly shifted beam relative to the output of the selected laser.

17. The method of claim 15, wherein the index of refraction of the first prism is tuned by controlling the temperature of the first prism.

18. The method of claim 17, wherein controlling the temperature of the first prism is achieved by mounting the first prism onto a thermally insulative base that has been patterned with a metal strip heater.

19. The method of claim 18, further comprising:

securing a thermistor to a surface of the first prism to allow the temperature of the first prism to be monitored.

20. The method of claim 15, wherein the optical spectrum reshaper is one of a single cavity filter, a coupled multi-cavity filter, a thin film coupled multi-cavity filter, a periodic multi-cavity etalon, a fiber Bragg grating, or a ring resonator filter.

* * * * *